United States Patent
Lee

(10) Patent No.: US 7,320,943 B2
(45) Date of Patent: Jan. 22, 2008

(54) CAPACITOR WITH HAFNIUM, LANTHANUM AND OXYGEN MIXED DIELECTRIC AND METHOD FOR FABRICATING THE SAME

(75) Inventor: Kee-Jeung Lee, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 337 days.

(21) Appl. No.: 10/883,322

(22) Filed: Jun. 30, 2004

(65) Prior Publication Data

US 2005/0139965 A1  Jun. 30, 2005

(30) Foreign Application Priority Data

Dec. 29, 2003 (KR) .................. 10-2003-0098534

(51) Int. Cl.
*H01L 21/31* (2006.01)
*H01L 21/469* (2006.01)

(52) U.S. Cl. .............. 438/778; 438/785; 257/E21.193; 257/E21.279; 257/E21.29; 257/E21.648; 257/E21.28

(58) Field of Classification Search .............. 438/778, 438/785; 257/E21.193, E21.274, E21.29, 257/E21.648, E21.28
See application file for complete search history.

(56) References Cited

U.S. PATENT DOCUMENTS

| 2003/0205729 | A1 | 11/2003 | Basceri et al. | |
| 2003/0213987 | A1 | 11/2003 | Basceri et al. | |
| 2004/0038554 | A1* | 2/2004 | Ahn et al. | ................. 438/778 |
| 2004/0046197 | A1* | 3/2004 | Basceri et al. | ............. 257/296 |

FOREIGN PATENT DOCUMENTS

KR   1997-0054073   7/1997

* cited by examiner

*Primary Examiner*—Walter Lindsay, Jr.
(74) *Attorney, Agent, or Firm*—Blakely Sokoloff Taylor & Zafman

(57) ABSTRACT

Disclosed is a capacitor with a dielectric layer having a low equivalent oxide thickness compared to a $HfO_2$ layer and capable of decreasing a level of a leakage current incidence and a method for fabricating the same. Particularly, the capacitor includes: a bottom electrode; a $Hf_{1-x}La_xO$ layer on the bottom electrode; and a top electrode on the $Hf_{1-x}La_xO$ layer, wherein x is an integer. The method includes the steps of: forming at least one bottom electrode being made of polysilicon doped with impurities; nitriding a surface of the bottom electrode; depositing the amorphous $Hf_{1-x}La_xO$ layer on the nitrided surface of the bottom electrode; performing a thermal process for crystallizing the amorphous $Hf_{1-x}La_xO$ layer and removing impurities existed within the $Hf_{1-x}La_xO$ layer; nitriding a surface of the crystallized $Hf_{1-x}La_xO$ layer; and forming the top electrode being made of polysilicon doped with impurities on the nitrided surface of the crystallized $Hf_{1-x}La_xO$ layer.

25 Claims, 6 Drawing Sheets

CAPACITOR WITH HAFNIUM, LANTHANUM AND OXYGEN MIXED DIELECTRIC AND METHOD FOR FABRICATING THE SAME

FIELD OF THE INVENTION

The present invention relates to a method for fabricating a semiconductor device; and more particularly to a capacitor and a method for fabricating the same.

DESCRIPTION OF RELATED ARTS

Recently, an accelerated integration level of semiconductor memory devices has led to a sharp decrease in a unit cell area. Also, an operation voltage has been decreased to a low level. However, despite of the decreased cell area, a minimum capacitance required for operating a memory device is greater than 25 fF/cell in order to prevent incidences of soft error and shortened refresh time.

In general, even though a nitride/oxide (NO) capacitor of a dynamic random access memory (DRAM) using $Si_3N_4$ as a dielectric layer uses a three dimensional storage node having a large electrode surface of a hemisphere shape, a height of the storage node should be continuously increased in order to secure the large capacitance.

Furthermore, the NO capacitor shows a limitation of securing the capacitance of greater than 256 M required for a next generation DRAM product. Therefore, a development of the capacitor using a dielectric layer with a high electric permittivity such as $Ta_2O_5$, $Al_2O_3$ having a dielectric constant ($\epsilon$) of 9 or $HfO_2$ having a dielectric constant ($\epsilon$) of 20, replacing $Si_3N_4$ recently has been proceeded.

However, $Ta_2O_5$ has a smaller band gap than $SiO_2$ or $Si_3N_4$, thereby having a high current leakage. Therefore, a leakage current problem should be solved to use $Ta_2O_5$ as a dielectric material of the capacitor.

An aluminum oxide ($Al_2O_3$) layer has an advantage in terms of the leakage current problem compared to $Ta_2O_5$. However, there is a limitation of securing the capacitance of the capacitor since the $Al_2O_3$ layer does not have the large dielectric constant ($\epsilon$).

Lastly, the hafnium oxide ($HfO_2$) layer has an advantage in terms of obtaining the capacitance having a large capacitance among ultra high integrated memory devices of greater than 256 M DRAM level applied with a metal interconnect process using a metal interconnect with a size of less than 100 nm. However, the $HfO_2$ layer has a problem of increasing the leakage current during a subsequent thermal process due to a structural weakness of the layer itself.

FIG. 1 is a graph illustrating a leakage current characteristic when performing a subsequent thermal process to a hafnium oxide ($HfO_2$) layer.

Referring to FIG. 1, when performing the thermal process at a high temperature of higher than 500° C., the leakage current is increased due to a structural weakness of the layer itself, as the $HfO_2$ layer is crystallized. Furthermore, if the thermal process is proceeded at a temperature of higher than 700° C., the leakage current is abruptly increased and all of memory information is lost. Also, there is a problem of a decrease in tolerance of the capacitor, and thus, the $HfO_2$ layer is very weak to a repeated electric shock due to a low breakdown voltage of the $HfO_2$ layer itself.

In addition, if the thermal process proceeds to the $HfO_2$ layer at a high temperature in an atmosphere of oxygen, the $HfO_2$ layer cannot have a limit thickness with respect to tolerance to oxidation and a silicon oxide layer ($SiO_2$) is abruptly increased at an interface between a bottom electrode and the $HfO_2$ layer. If so, the $HfO_2$ layer should be maintained with a predetermined thickness because an equivalent oxide thickness (Tox) of the dielectric layer of the capacitor is abruptly increased. Accordingly, it is difficult to make a thin $HfO_2$ layer.

In general, the Tox is a value of a thickness of a dielectric material layer formed with other dielectric layers than the silicon oxide layer calculated in terms of a thickness of the dielectric layer formed with the silicon oxide layer. The lower the value of the Tox, the larger the capacitance.

SUMMARY OF THE INVENTION

It is, therefore, an object of the present invention to provide a capacitor with a dielectric layer having a low equivalent oxide thickness compared to the $HfO_2$ layer and capable of decreasing a level of a leakage current incidence and a method for fabricating the same.

In accordance with one aspect of the present invention, there is provided a capacitor, comprising: a bottom electrode; a $Hf_{1-x}La_xO$ layer on the bottom electrode; and a top electrode on the $Hf_{1-x}La_xO$ layer, wherein x representing a ratio composition is an integer.

In accordance with another aspect of the present invention, there is provided a method for fabricating a capacitor, including the steps of: forming at least one bottom electrode; depositing an amorphous $Hf_{1-x}La_xO$ layer on the bottom electrode; performing a thermal process for crystallizing the $Hf_{1-x}La_xO$ layer and removing impurities existed therein; and forming the top electrode on the crystallized $Hf_{1-x}La_xO$ layer.

In accordance with further aspect of the present invention, there is provided a method for fabricating the capacitor, including the steps of: forming at least one bottom electrode being made of polysilicon doped with impurities; nitriding a surface of the bottom electrode; depositing the amorphous $Hf_{1-x}La_xO$ layer on the nitrided surface of the bottom electrode; performing a thermal process for crystallizing the amorphous $Hf_{1-x}La_xO$ layer and removing impurities existed within the $Hf_{1-x}La_xO$ layer; nitriding a surface of the crystallized $Hf_{1-x}La_xO$ layer; and forming the top electrode being made of polysilicon doped with impurities on the nitrided surface of the crystallized $Hf_{1-x}La_xO$ layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on preferred embodiments of the present invention will be provided with reference to the accompanying drawings.

Figure 1:
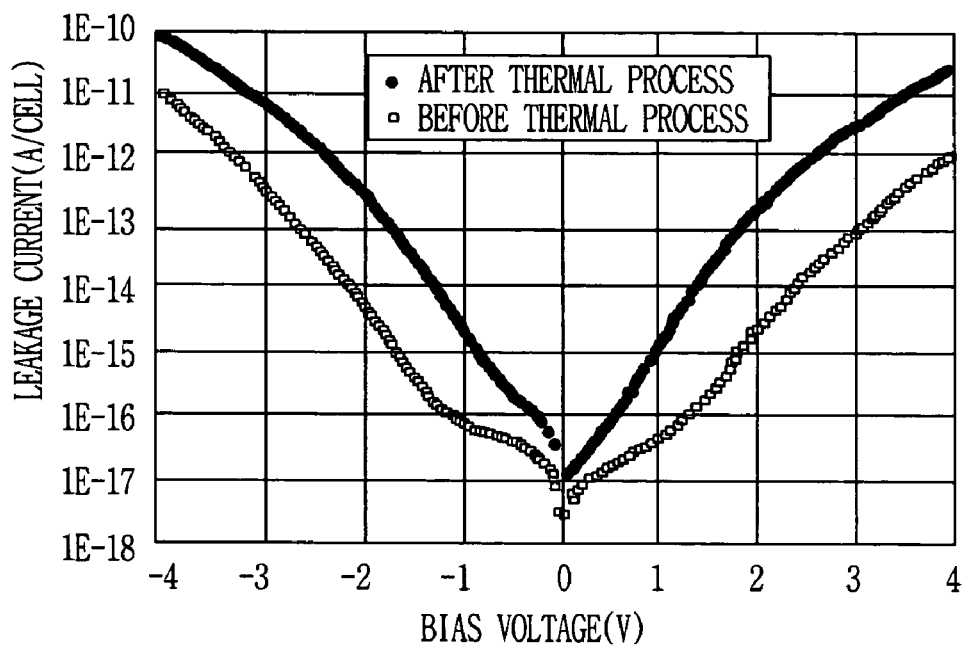
FIG. 1 is a graph showing a leakage current characteristic during performing a subsequent thermal process to a $HfO_2$ layer according to a conventional method.
Figure 2:
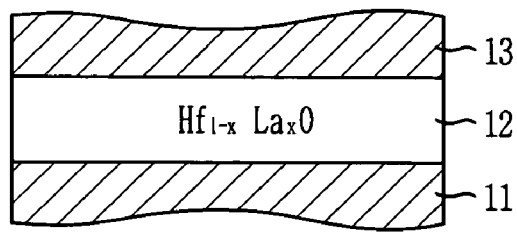
FIG. 2 is a cross-sectional view illustrating a structure of a capacitor in accordance with a preferred embodiment of the present invention.

FIG. 2 is a cross-sectional view illustrating a structure of a capacitor in accordance with a preferred embodiment of the present invention.

As shown, the capacitor is formed by sequentially stacking a bottom electrode 21, a molecular structure of hafnium, lanthanum and oxygen 22 and an upper electrode 23. Hereinafter, the hafnium, lanthanum and oxygen have a $Hf_{1-x}La_xO$ layer, in which x represents molecular composition ratio.

More specifically, the bottom electrode 21 and the upper electrode 23 are made of a metal conductive material selected from a group consisting of phosphorus (P) or arsenic (As) doped polysilicon, titanium nitride (TiN), ruthenium (Ru), ruthenium oxide ($RuO_2$), platinum (Pt), iridium (Ir) and iridium oxide ($IrO_2$). For instance, the bottom electrode 21 and the upper electrode 23 are made of polysilicon, thereby forming a silicon-insulator-silicon (SIS) capacitor structure. For another example, the bottom electrode 21 can be made of polysilicon, and the upper electrode can be made of one of metal and metal oxide. Thus, a metal-insulator-metal (MIM) capacitor structure is formed. In addition, the bottom electrode 21 can be formed in one of a stack type, a concave type and a cylinder type.

Next, the $Hf_{1-x}La_xO$ layer 22 used as a dielectric material and placed between the bottom electrode 21 and the upper electrode 22 contains lanthanum (La) in a hafnium oxide ($HfO_2$) layer. Herein, lanthanum components account for small portions of the $Hf_{1-x}La_xO$ layer, referring to the composition ratio X ranging from approximately 0.03 to approximately 0.1, wherein even though the small portions of lanthanum is contained in the $Hf_{1-x}La_xO$ layer, it is possible to obtain a better characteristic compared to the $HfO_2$ layer.

For instance, a dielectric constant ($\epsilon$) of the $HfO_2$ layer is 20, but the dielectric constant ($\epsilon$) of the $Hf_{1-x}La_xO$ layer ranges from approximately 30 to approximately 50. Herein, if lanthanum components are as small as approximately 0.03, the dielectric constant ($\epsilon$) is closed to approximately 30 and if the lanthanum components are as large as approximately 0.1, the dielectric constant ($\epsilon$) is closed to approximately 50.

As mentioned above, an equivalent oxide thickness (Tox) can be lowered by adjusting the dielectric constant ($\epsilon$) with control of the lanthanum components of the $Hf_{1-x}La_xO$ layer. Thus, a degree of integration is improved by making the thin $Hf_{1-x}La_xO$ layer.

Besides the dielectric constant ($\epsilon$), a level of leakage current generations and a breakdown voltage characteristic also can be determined by adjusting the lanthanum components of the $Hf_{1-x}La_xO$ layer.

The $Hf_{1-x}La_xO$ layer can be fabricated with use of an atomic layer deposition method, a pulsed chemical vapor deposition method or a low pressure chemical vapor deposition method.

Figure 3:
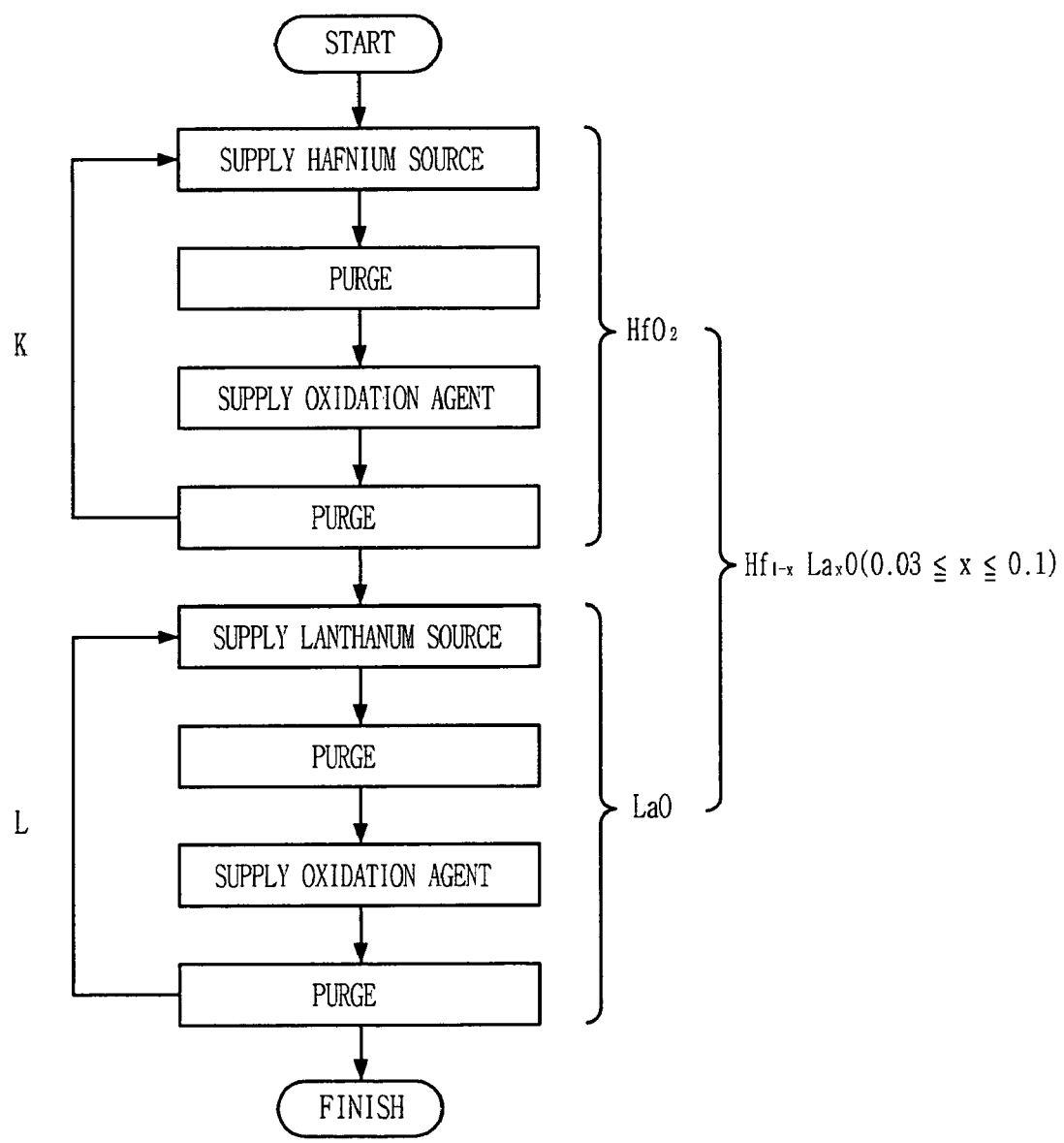
FIG. 3 is a flowchart illustrating an atomic layer deposition method for fabricating a $Hf_{1-x}La_xO$ layer in accordance with a first preferred embodiment of the present invention.

FIG. 3 is a flowchart illustrating an atomic layer deposition method for fabricating a $Hf_{1-x}La_xO$ layer in accordance with a first preferred embodiment of the present invention.

Referring to FIG. 3, a $HfO_2$ deposition cycle expresses sequential steps of providing a source gas of hafnium (Hf), a purge gas, an oxidation agent, and a purge gas, and this cycle is repeatedly performed K times. Also, a LaO deposition cycle expresses sequential steps of providing a source gas of lanthanum (La), a purge gas, an oxidation agent, and a purge gas, and this cycle is repeatedly performed L times. Thereby, the $Hf_{1-x}La_xO$ layer being made of a combination of $HfO_2$ and LaO is deposited. Herein, the ratio of repeating the number of the two cycles, i.e., K and L, needs to be controlled in a ratio of 9 to 1 in order to control the composition ratio X of the lanthanum contained in the $Hf_{1-x}La_xO$ layer in a small range between approximately 0.03 and approximately 0.1.

Referring to FIG. 3, as for the $HfO_2$ deposition cycle, $C_{16}H_{36}HfO_4$ or a metal organic compound, i.e., tetrakis-diethylamino-hafnium (TDEAHf) or tetrakis-ethylmethylamino hafnium (TEMAHf), can be used as a precursor and ozone ($O_3$) gas with a concentration of $200\pm20$ g/m$^3$, oxygen ($O_2$) gas (or oxygen plasma), or water ($H_2O$) vapor can be used as the oxidation agent. An inert gas such as argon (Ar) or nitrogen ($N_2$) can be used as the purge gas as well.

As for the LaO deposition cycle, $La(CH_3)_3$, $La(C_2H_5)_3$ or a metal organic compound containing lanthanum is used as a precursor and $O_3$ gas with a density of $200\pm20$ g/m$^3$, $O_2$ gas (or oxygen plasma), or $H_2O$ vapor can be used as the oxidation agent. An inert gas such as Ar or $N_2$ can be used as the purge gas as well.

More specific to the $HfO_2$ deposition cycle in more details, a hafnium source with a flow rate ranging from approximately 50 sccm to approximately 500 sccm is first supplied to a chamber to make the $HfO_2$ source gas molecules chemically adsorbed onto a surface of a substrate. Then, a non-reacted hafnium source is purged out. Thereafter, an oxidation agent reacted with the adsorbed hafnium source gas is supplied with a flow rate ranging from approximately 0.1 slm to approximately 1 slm. From this chemical reaction, a hafnium gas is deposited in a form of a single atomic layer. Thereafter, a purge gas is supplied to purge out the non-reacted oxidation agent and a volatile reacted byproduct.

More specific to the LaO deposition cycle in more details, a lanthanum source with a flow rate ranging from approximately 50 sccm to approximately 500 sccm is first supplied to a chamber to make the LaO source gas molecules chemically adsorbed onto a surface of a substrate. Then, a non-reacted lanthanum source is purged out. Thereafter, an oxidation agent reacted with the adsorbed lanthanum source gas is supplied with a flow rate ranging from approximately 0.1 slm to approximately 1 slm. From this chemical reaction, a lanthanum gas is deposited in a form of a single atomic layer. Thereafter, a purge gas is supplied to purge out the non-reacted oxidation agent and a volatile reacted byproduct.

The $Hf_{1-x}La_xO$ layer 22 shown in FIG. 2 also can be deposited by a pulsed chemical vapor deposition (pulsed CVD) method using a cycle alternatively supplying a pulse in a similar way of the atomic layer deposition (ALD) method. That is, the $Hf_{1-x}La_xO$ layer mixing $HfO_2$ and LaO is deposited by inducing a reaction between a source gas and an oxidation agent with supply of the source gas and the oxidation agent in a pulse type, respectively.

As for the pulsed chemical vapor deposition method, the hafnium source uses $C_{16}H_{36}HfO_4$ or a metal organic compound, i.e., TDEAHf or TEMAHf, as a precursor and the lanthanum source uses a metal compound containing lanthanum as a precursor. The oxidation agent uses $O_3$ gas with a density of 200±20 g/m³, O₂ gas (or oxygen plasma), or H₂O vapor. An inert gas such as Ar or N₂ can be used as the purge gas as well.

Figure 4:
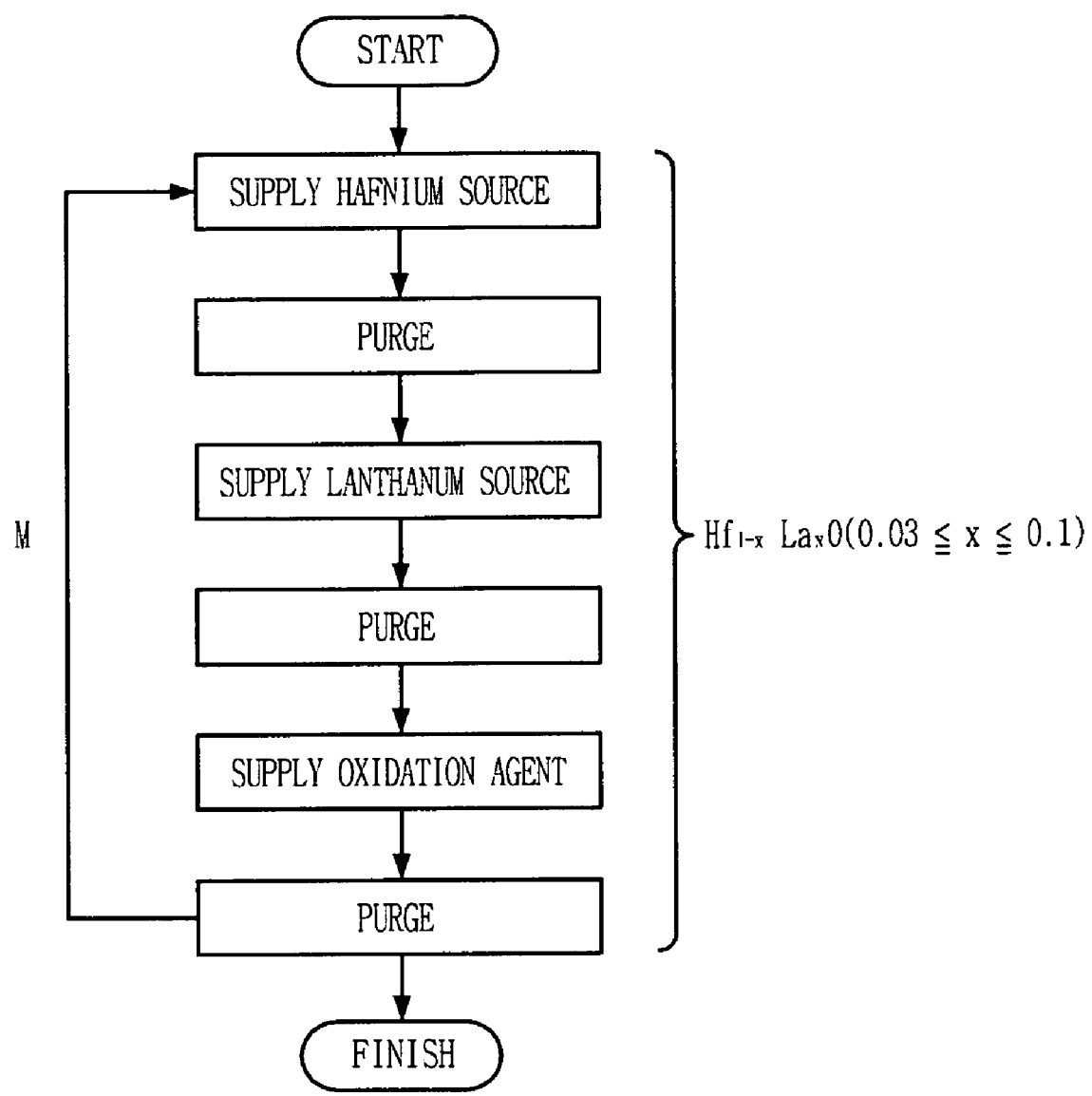
FIG. 4 is a flowchart illustrating an atomic layer deposition method for fabricating a $Hf_{1-x}La_xO$ layer in accordance with a second preferred embodiment.

FIG. 4 is a flowchart showing an atomic layer deposition (ALD) method for fabricating a $Hf_{1-x}La_xO$ layer in accordance with a second preferred embodiment of the present invention.

Referring to FIG. 4, a $HfO_2$ deposition cycle expresses sequential steps of providing a source gas of hafnium (Hf), a purge gas, a lanthanum gas, a purge gas, an oxidation agent and a purge gas, and the $Hf_{1-x}La_xO$ layer is deposited through repeatedly performing this cycle M times, wherein M is an integer. Herein, the ratio of repeating the number of the two cycles, i.e., K and L, needs to be controlled in a ratio of 9 to 1 in order to control the composition ratio x of the lanthanum contained in the $Hf_{1-x}La_xO$ layer in a small range between approximately 0.03 and approximately 0.1. The K and L are integers.

The deposition cycle shown in FIG. 4, the hafnium source uses $C_{16}H_{36}HfO_4$ or a metal organic compound, i.e., TDEAHf or TEMAHf, as a precursor and the lanthanum source uses a metal compound containing lanthanum as a precursor. The oxidation agent uses $O_3$ gas with a concentration of 200±20 g/m³, O₂ gas (or oxygen plasma), or H₂O vapor. An inert gas such as Ar or N₂ can be used as the purge gas as well.

By using the deposition cycles shown in FIGS. 3 and 4, the $Hf_{1-x}La_xO$ layer is deposited in an amorphous form with a thickness ranging from approximately 30 Å to approximately 100 Å. Thereafter, the thermal process proceeds to crystallize the $Hf_{1-x}La_xO$ layer and remove impurities existed in the $Hf_{1-x}La_xO$ layer. At this time, the thermal process should be employed at a temperature ranging from approximately 500° C. to approximately 900° C. in an atmosphere of nitrogen under an ascending or descending pressure by using a furnace or a rapid thermal process apparatus. Specifically, the $Hf_{1-x}La_xO$ layer mixing $HfO_2$ and Lao is deposited, thereby forming a crystallized $Hf_{1-x}La_xO$ layer having a mixture of Hf, La and O through the thermal process.

Figure 5:
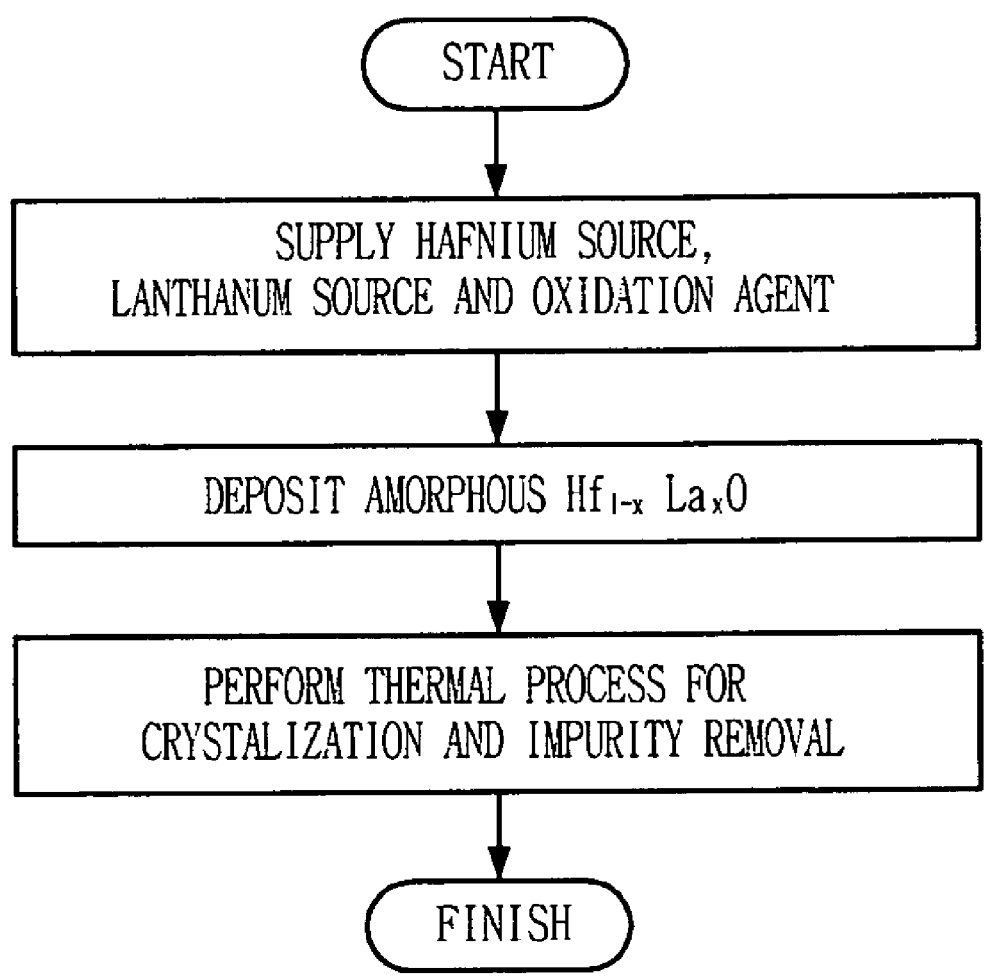
FIG. 5 is a flowchart illustrating a low pressure chemical vapor deposition method for fabricating a $Hf_{1-x}La_xO$ layer in accordance with a preferred embodiment of the present invention.

FIG. 5 is a flowchart showing a low pressure chemical vapor deposition (LPCVD) method for fabricating a $Hf_{1-x}La_xO$ layer in accordance with a preferred embodiment of the present invention.

Referring to FIG. 5, the hafnium source, the lanthanum source and the oxidation agent are supplied to a low pressure chemical vapor deposition (LPCVD) chamber maintained at a temperature ranging from approximately 250° C. and approximately 500° C., thereby depositing an amorphous $Hf_{1-x}La_xO$ layer. Thereafter, the thermal process is proceeded in order to crystallize the amorphous $Hf_{1-x}La_xO$ layer for improving a dielectric characteristic and to remove carbon impurities existed in the $Hf_{1-x}La_xO$ layer.

Herein, the hafnium source and a lanthanum source are supplied with use of a precursor made up of the metal organic compound. At this time, as maintaining a ratio of 9 parts of the hafnium source to 1 part of the lanthanum source with use of a flow rate controller such as a mass flow controller (MFC), a fixed amount of the precursors is supplied through en evaporator maintained with a temperature ranging from approximately 150° C. to approximately 300° C., and thereby being supplied to the LPCVD chamber after vaporized.

And, the thermal process for crystallizing the $Hf_{1-x}La_xO$ layer and removing the carbon impurities from the $Hf_{1-x}La_xO$ layer should be employed at a temperature ranging from approximately 500° C. to approximately 900° C. in an atmosphere of nitrogen under an ascending or descending pressure by using a furnace or a rapid thermal process apparatus.

If the $Hf_{1-x}La_xO$ layer formed by the methods described in FIGS. 3 to 5 is used as a dielectric layer of the capacitor, it is possible to obtain the relatively large capacitance compared to the capacitor with use of the $HfO_2$ layer because it is possible to obtain an equivalent oxide thickness (Tox) ranging from approximately 10 Å to approximately 20 Å.

Furthermore, the capacitor employing the $HF_{1-x}La_xO$ layer can obtain a low level of the leakage current incidence and a strong breakdown voltage characteristic compared to the capacitor with use of the $HfO_2$ layer.

Furthermore, the $Hf_{1-x}La_xO$ layer is thermally much stable than the $HfO_2$ layer and thus, an electric characteristic is not degraded by a subsequent thermal process unavoidably accompanied with a subsequent collecting process.

FIGS. 6A to 6D are cross-sectional views illustrating a method for fabricating a capacitor with use of hafnium, lanthanum and oxygen as a dielectric layer. Specifically, a method for fabricating a concave type capacitor is illustrated.

Figure 6A:
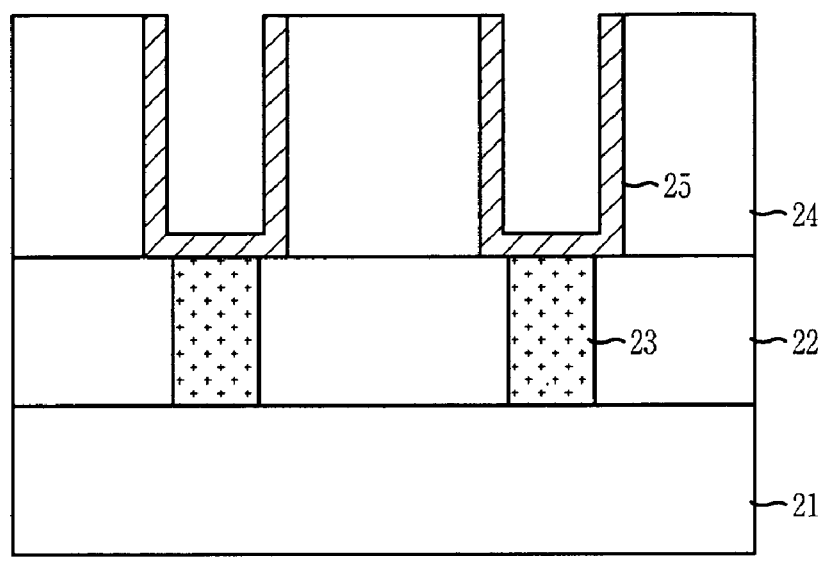
FIGS. 6A to 6D are cross-sectional views illustrating a method for fabricating a capacitor employing a $Hf_{1-x}La_xO$ layer as a dielectric layer.

Referring to FIG. 6A, an inter-layer insulation layer 22 is formed on a substrate 21. Then, a plurality of storage node contact plugs 23 are buried into corresponding contact holes 22A formed by etching the inter-layer insulation layer 22.

Next, a capacitor oxide layer 24 determining a height of a bottom electrode is formed on the inter-layer insulation layer 22. Then, a plurality of storage node holes 24A defining a region where the bottom electrode is formed are formed by etching the capacitor oxide layer 24.

Next, a conductive layer for use in a bottom electrode is formed on the capacitor oxide layer 24 and the storage node hole 24A, and then, a bottom electrode isolation process for forming aforementioned bottom electrodes 25, connected to the storage node contact plugs 23, inside the storage node hole 24A proceeds. At this time, the bottom electrode isolation process is employed to form a cylinder type capacitor only inside the storage node contact hole 24A by removing the conductive layer formed on a top portion of the capacitor oxide layer 24 through employing a chemical mechanical polishing process or an etch-back process. Herein, since there is a possibility that impurities such as an abrasive material and an etched particle are stuck to inner surfaces of the cylinder when the conductive layer is removed, the cylinder is first filled with a photoresist having an excellent step coverage property. Thereafter, the chemical mechanical polishing process or the etch-back process is carried out until a surface of the capacitor oxide layer 24 is exposed and then, the photoresist existed inside of the cylinder is removed through an ashing process.

More specifically, the bottom electrode 25 is made of a conductive metal-based material selected from a group consisting of phosphorus (P) or arsenic (As) doped polysilicon, titanium nitride (TiN), ruthenium (Ru), ruthenium oxide ($RuO_2$), platinum (Pt), iridium (Ir) and iridium oxide ($IrO_2$).

Hereinafter, it is assumed that the bottom electrode 25 is formed with polysilicon.

Next, a pre-cleaning process proceeds to terminate hydrogen and remove a native oxide layer on the surface of the bottom electrode 25. At this time, the pre-cleaning process is performed with use of a HF mixed solution, i.e., HF diluted with water in a ratio of approximately 10 parts to 100 parts of $H_2O$ to 1 part of HF or a deionized (DI) water mixture diluted in a ratio of approximately 5 to 500 parts of NH$_4$F to 1 part of HF along with use of a DI mixture.

before or after the pre-cleaning process with use of the HF mixed solution, the bottom electrode 25 can be cleaned one more time by using a NH$_4$OH mixed solution obtained by mixing NH$_4$, H$_2$O$_2$ and H$_2$O, or a H$_2$SO$_4$ mixed solution obtained by mixing H$_2$SO$_4$, H$_2$O$_2$ or mixing H$_2$SO$_4$ and H$_2$O, in order to remove impurities such as inorganic matters or organic matters on the surface of the bottom electrodes 25.

Figure 6B:
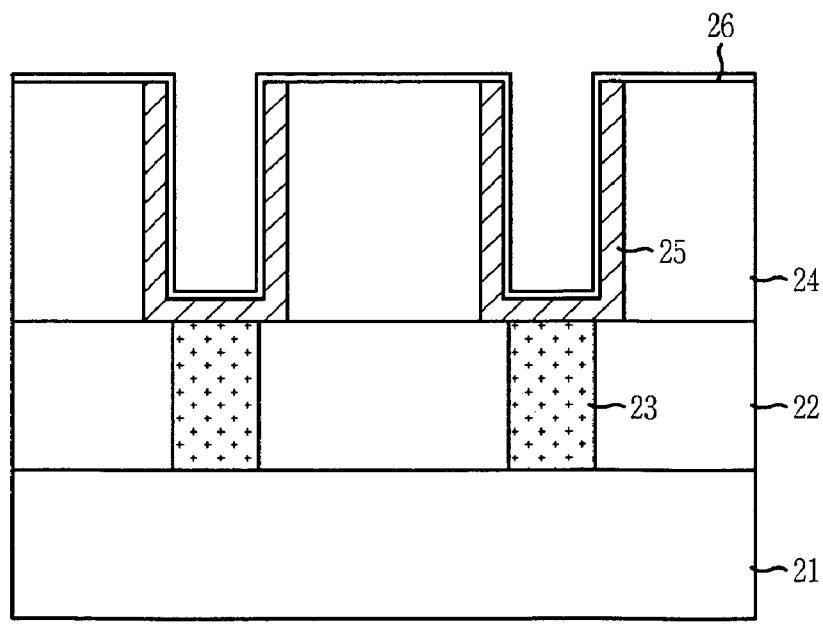

Referring to FIG. 6B, a nitride layer 26 is formed on the bottom electrode 25. At this time, the nitride layer 26 is a diffusion barrier layer for preventing silicon or the doped impurities of the bottom electrode 25 from penetrating into a dielectric layer, i.e., a Hf$_{1-x}$La$_x$O layer, contacting the bottom electrodes 25.

As mentioned above, the nitride layer 26 serving as the diffusion barrier layer is formed by nitriding the surface of the bottom electrode 25. For instance, a method of nitriding the surface of the bottom electrode 25 is to proceed the thermal process using a plasma with supply of a radio frequency (RF) power ranging from approximately 100 W to approximately 500 W within a chamber in an atmosphere of NH$_3$ ranging from approximately 25 sccm to approximately 250 sccm for approximately 1 minute to approximately 5 minutes. Herein, the chamber is maintained at a temperature ranging from approximately 200° C. to approximately 500° C. and a pressure ranging from approximately 0.1 torr to approximately 10 torr.

Another method to obtain the nitrided bottom electrode 25 is to proceed the thermal process within a chamber for a rapid thermal process in an ascending pressure ranging from approximately 750 torr to approximately 760 torr, or in a descending pressure ranging from approximately 1 torr to approximately 100 torr and in an atmosphere of NH$_3$ supplied with a flow rate ranging from approximately 25 sccm to approximately 250 sccm at a temperature ranging from approximately 600° C. to approximately 800° C. or to proceed an annealing process at a furnace under the same condition described above.

During the nitriding process, a surface of the capacitor oxide layer 24 mainly being made of silicon oxide layer is simultaneously nitrided.

Figure 6C:
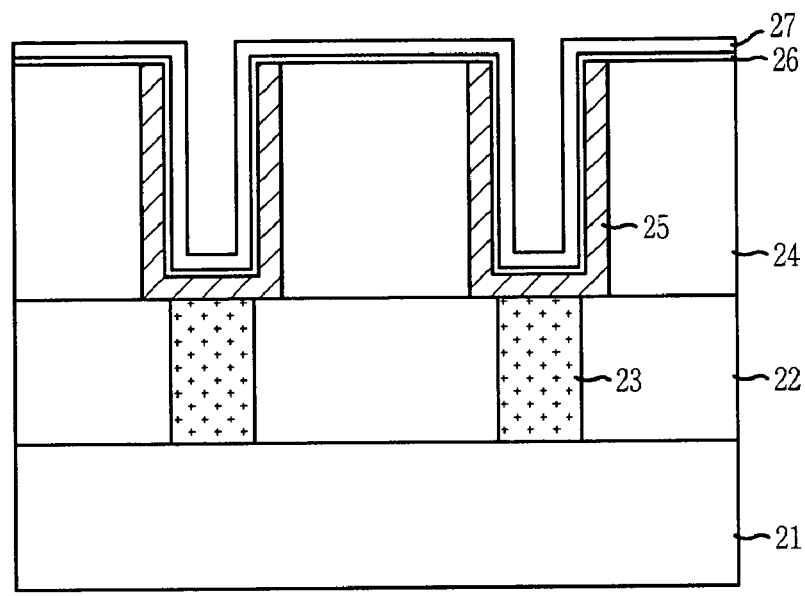

Referring to FIG. 6C, the above mentioned Hf$_{1-x}$La$_x$O layer 27 is formed on the nitride layer 26 by using one of the methods described on FIGS. 3 to 5.

Next, the thermal process for crystallizing the Hf$_{1-x}$La$_x$O layer 27 and removing the impurities within the layer is carried out. At this time, the thermal process is performed at a temperature ranging from approximately 500° C. to approximately 900° C. in an atmosphere of nitrogen under an ascending or descending pressure by using a furnace or a rapid thermal process apparatus.

Figure 6D:
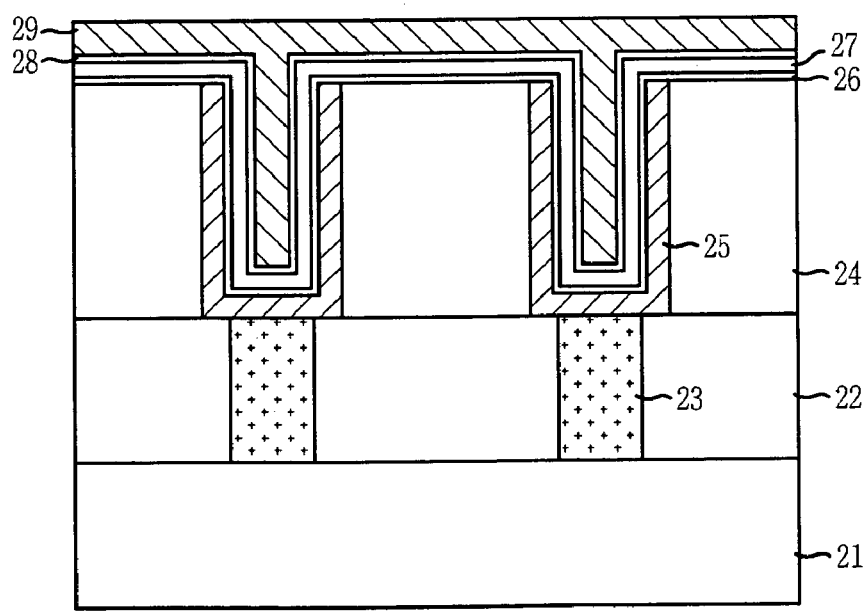

Referring to FIG. 6D, the upper electrode 29 is formed on the Hf$_{1-x}$La$_x$O layer 27. At this time, the upper electrode 29 is made of a conductive metal-based material selected from a group consisting of phosphorus (P) or arsenic (As) doped polysilicon, titanium nitride (TiN), ruthenium (Ru), ruthenium oxide (RuO$_2$), platinum (Pt), iridium (Ir) and iridium oxide (IrO$_2$). In this case, a silicon nitride layer or a doped polysilicon layer can be formed on the upper electrode 29 with a thickness ranging from approximately 200 Å to approximately 1000 Å in order to improve a structural stability to humidity, a temperature, and an electric shock.

If the upper electrode 29 is made of polysilicon doped with impurities, it is necessary to have a diffusion barrier layer 28 for preventing the silicon or the impurities of the upper electrode from diffusing into the Hf$_{1-x}$La$_x$O layer 27.

The diffusion barrier layer 28 contains nitrogen as the nitride layer 26 formed on the surface of the bottom electrode 25 does and is formed by nitriding the Hf$_{1-x}$La$_x$O layer 27.

A method of nitriding the surface of the Hf$_{1-x}$La$_x$O layer 27 is to proceed a thermal process using a plasma with supply of a RF power ranging from approximately 100 W to approximately 500 W within a chamber, set in an atmosphere of NH$_3$ provided with a flow rate ranging from approximately 25 sccm to approximately 250 sccm for approximately 1 minute to approximately 5 minutes. Also, the chamber is maintained with a temperature ranging from approximately 200° C. to approximately 500° C. and a pressure ranging from approximately 0.1 torr to approximately 10 torr.

Another method to obtain the nitrided bottom electrodes 25 is to proceed a thermal process within a chamber for a rapid thermal process in an ascending pressure ranging from approximately 750 torr to approximately 760 torr, or in a descending pressure ranging from approximately 1 torr to approximately 100 torr and in an atmosphere of ammonia (NH$_3$) provided with a flow rate ranging from approximately 25 sccm to approximately 250 sccm along with a maintained temperature ranging from approximately 600° C. to approximately 800° C. Another method of nitriding the bottom electrodes is to employ an annealing process by using a furnace under the condition as above.

The present invention brings an effect of obtaining the large capacitance with use of the HF$_{1-x}$La$_x$O layer as the dielectric layer of the capacitor, wherein the HF$_{1-x}$La$_x$O layer decreases the leakage current incidence with a thin equivalent oxide thickness (Tox) compared to the HfO2 layer. Furthermore, there is an effect of simultaneously improving tolerance and reliability of the capacitor among the memory device products applied with a metal interconnect process using a metal interconnect with a size of less than 100 nm by selecting the HF$_{1-x}$La$_x$O layer which is thermally stable compared to the HfO$_2$ layer as the dielectric layer of the capacitor.

The present application contains subject matter related to the Korean patent application No. KR 2003-0098534, filed in the Korean Patent Office on Dec. 29, 2003 the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a capacitor, comprising:
   forming at least one bottom electrode;
   depositing an amorphous Hf$_{1-x}$La$_x$O layer on the bottom electrode wherein x is between 0.03 and 0.1;
   performing a thermal process for crystallizing the Hf$_{1-x}$La$_x$O layer and removing impurities existed therein; and
   forming a top electrode on the crystallized Hf$_{1-x}$La$_x$O layer.

2. The method of claim 1, wherein the amorphous Hf$_{1-x}$La$_x$O layer is deposited through one of an atomic layer deposition method, a pulsed chemical vapor deposition method and a low pressure chemical vapor deposition method.

3. The method of claim 2, wherein depositing the amorphous $Hf_{1-x}La_xO$ layer through the atomic layer deposition method includes:
repeatedly performing a $HfO_2$ deposition cycle expressing sequential steps of providing a hafnium source gas, a purge gas, an oxidation agent, and a purge gas K times, wherein K is a positive integer;
repeatedly performing a LaO deposition cycle expressing sequential steps of providing a lanthanum source gas, a purge gas, an oxidation agent, and a purge gas L times, wherein L is a positive integer; and
controlling a ratio of repeating the number of the two cycles to control the composition ratio x of lanthanum to be in a range from approximately 0.03 to approximately 0.1.

4. The method of claim 2, wherein during depositing the amorphous $Hf_{1-x}La_xO$ layer with use of the atomic layer deposition method, the amorphous $Hf_{1-x}La_xO$ deposition cycle expressing sequential steps of providing a hafnium source gas, a purge gas, a lanthanum source gas, and an oxidation gas is performed repeatedly and the number of supplying the lanthanum source gas is controlled to make the composition ratio x of lanthanum range from approximately 0.03 to approximately 0.1.

5. The method of claim 3, wherein the hafnium source uses one of $C_{16}H_{36}HfO_4$, tetrakis-diethylamino-hafnium (TDEAHf) and tetrakis-ethylmethylamino hafnium (TEMAHf); the lanthanum source uses one of $La(CH_3)_3$ and $La(C_2H_5)_3$; the oxidation agent uses one of $O_3$ gas having a concentration of approximately $200\pm20$ $g/m^3$, $O_2$ gas and $H_2O$ vapor; and the purge gas uses one of Ar and $N_2$.

6. The method of claim 4, wherein the hafnium source uses one of $C_{16}H_{36}HfO_4$, tetrakis-diethylamino-hafnium (TDEAHf) and tetrakis-ethylmethylamino hafnium (TEMAHf); the lanthanum source uses one of $La(CH_3)_3$ and $La(C_2H_5)_3$; the oxidation agent uses one of $O_3$ gas having a concentration of approximately $200\pm20$ $g/m^3$, $O_2$ gas and $H_2O$ vapor; and the purge gas uses one of Ar and $N_2$.

7. The method of claim 2, wherein during forming the amorphous $Hf_{1-x}La_xO$ layer with use of the low chemical vapor deposition method, a hafnium source, a lanthanum source and an oxidation agent are supplied to a low pressure chemical vapor deposition chamber maintained at a temperature ranging from approximately 250° C. and approximately 500° C.

8. The method of claim 7, wherein the hafnium source and the lanthanum source are obtained by supplying an individual vaporized precursor being made of a metal organic compound to a low pressure chemical vapor deposition and a ratio of the hafnium source to the lanthanum is controlled to obtain the composition ratio x of lanthanum in a range from approximately 0.03 to approximately 0.1.

9. The method of claim 7, wherein the hafnium source uses one of $C_{16}H_{36}HfO_4$, tetrakis-diethylamino-hafnium (TDEAHf) and tetrakis-ethylmethylamino hafnium (TEMAHf); the lanthanum source uses one of $La(CH_3)_3$ and $La(C_2H_5)_3$; and the oxidation agent uses one of $O_3$ gas having a concentration of approximately $200\pm20$ $g/m^3$, $O_2$ gas and $H_2O$ vapor.

10. The method of claim 1, wherein the thermal process for crystallizing the $Hf_{1-x}La_xO$ layer and removing impurities existed within the $Hf_{1-x}La_xO$ layer proceeds at a temperature ranging from approximately 500° C. to approximately 900° C. by using one of an electric furnace and an apparatus for a rapid thermal process in one of an ascending and descending pressure and in an atmosphere of nitrogen.

11. The method of claim 1, wherein the bottom electrode and the top electrode are made of a conductive metal-based material selected from a group consisting of phosphorus (P), or arsenic (As) doped polysilicon, titanium nitride (TiN), ruthenium (Ru), ruthenium oxide ($RuO_2$), platinum (Pt), iridium (Ir) and iridium oxide ($IrO_2$).

12. A method for fabricating a capacitor, comprising:
forming at least one bottom electrode being made of polysilicon doped with impurities;
nitriding a surface of the bottom electrode;
depositing an amorphous $Hf_{1-x}La_xO$ layer on the nitrided surface of the bottom electrode;
performing a thermal process for crystallizing the amorphous $Hf_{1-x}La_xO$ layer and removing impurities existed within the $Hf_{1-x}La_xO$ layer;
nitriding a surface of the crystallized $Hf_{1-x}La_xO$ layer; and
forming a top electrode being made of polysilicon doped with impurities on the nitrided surface of the crystallized $Hf_{1-x}La_xO$ layer.

13. The method of claim 12, wherein the amorphous $Hf_{1-x}La_xO$ layer is formed under controlling a composition ratio x of lanthanum to range from approximately 0.03 to approximately 0.1.

14. The method of claim 13, wherein the amorphous $Hf_{1-x}La_xO$ layer is deposited through one of an atomic layer deposition method, a pulsed chemical vapor deposition method and a low pressure chemical vapor deposition method.

15. The method of claim 14, wherein the depositing the amorphous $Hf_{1-x}La_xO$ layer through the atomic layer deposition method includes:
repeatedly performing a $HfO_2$ deposition cycle expressing sequential steps of providing a hafnium source gas, a purge gas, an oxidation agent, and a purge gas K times, wherein K is a positive integer;
repeatedly performing a LaO deposition cycle expressing sequential steps of providing a lanthanum source gas, a purge gas, an oxidation agent, and a purge gas L times, wherein L is a positive integer; and
controlling a ratio of repeating the number of the two cycles to obtain the composition ratio x of lanthanum in a range from approximately 0.03 to approximately 0.1.

16. The method of claim 14, wherein during forming the amorphous $Hf_{1-x}La_xO$ layer with use of the atomic layer deposition method, the amorphous $Hf_{1-x}La_xO$ deposition cycle expressing sequential steps of providing a hafnium source gas, a purge gas, a lanthanum source gas, and the oxidation gas is performed repeajedly and the number of supplying the lanthanum source gas is controlled to have the composition ratio x of lanthanum in a range from approximately 0.03 to approximately 0.1.

17. The method of claim 15, wherein the hafnium source uses one of $C_{16}H_{36}HfO_4$, tetrakis-diethylamino-hafnium (TDEAHf) and tetrakis-ethylmethylamino hafnium (TEMAHf); the lanthanum source uses one of $La(CH_3)_3$ and $La(C_2H_5)_3$; the oxidation agent uses one of $O_3$ gas having a concentration of approximately $200\pm20$ $g/m^3$, $O_2$ gas and $H_2O$ vapor; and the purge gas uses one of Ar and $N_2$.

18. The method of claim 16, wherein the hafnium source uses one of $C_{16}H_{36}HfO_4$, tetrakis-diethylamino-hafnium (TDEAHf) and tetrakis-ethylmethylamino hafnium (TEMAHf); the lanthanum source uses one of $La(CH_3)_3$ and $La(C_2H_5)_3$, the oxidation agent uses one of $O_3$ gas having a concentration of approximately $200\pm20$ $g/m^3$, $O_2$ gas and $H_2O$ vapor; and the purge gas uses one of Ar and $N_2$.

19. The method of claim 14, wherein during forming the amorphous $Hf_{1-x}La_xO$ layer with use of the low chemical vapor deposition method, a hafnium source, a lanthanum source and an oxidation agen.t are supplied to a low pressure chemical vapor deposition chamber maintained at a temperature ranging from approximately 250° C. and approximately 500° C.

20. The method of claim 19, wherein the hafnium source and the lanthanum source are obtained by supplying an individual vaporized precursor being made of a metal organic compound to a low pressure chemical vapor deposition and a ratio of the hafnium source to the lanthanum is controlled to obtain the composition ratio x of lanthanum in a range from approximately 0.03 to approximately 0.1.

21. The method of claim 19, wherein the hafnium source uses one of $C_{16}H_{36}HfO_4$, tetrakis-diethylamino-hafnium (TDEAHf) and tetrakis-ethylmethylamino hafnium (TEMAHf); the lanthanum source uses one of $La(CH_3)_3$ and $La(C_2H_5)_3$; and the oxidation agent uses one of $O_3$ gas having a concentration of approximately 200±20 $g/m^3$, $O_2$ gas and $H_2O$ vapor.

22. The method of claim 12, wherein the thermal process for the amorphous $Hf_{1-x}La_xO$ layer and removing the impurities proceeds by employing one of an electric furnace and an apparatus for a rapid thermal process maintained with a temperature ranging from approximately 500° C. to approximately 900° C. in an atmosphere of nitrogen and in one of ascending and descending process.

23. The method of claim 12, wherein nitriding the surface of the bottom electrode and the crystallized $Hf_{1-x}La_xO$ layer proceeds by performing a plasma thermal process under supplying of radio frequency power ranging from approximately 100 W to approximately 500 W and at a temperature ranging from approximately 200° C. to approximately 500° C. and a pressure ranging from approximately 0.1 torr to approximately 10 torr in an atmosphere of $NH_3$ provided with a flow rate ranging from approximately 25 sccm to approximately 250 sccm for approximately 1 minute to approximately 5 minutes.

24. The method of claim 12, wherein the nitriding the surface of the bottom electrode and the crystallized $Hf_{1-x}La_xO$ layer proceeds by performing a rapid thermal process at a temperature ranging from approximately 600° C. to approximately 800° C. in an atmosphere of $NH_3$ provided with a flow rate ranging from approximately 25 sccm to approximately 250 sccm under one of an ascending pressure ranging from approximately 750 torr to approximately 760 torr and a descending pressure ranging from approximately 1 torr to approximately 100 torr.

25. The method of claim 12, wherein the nitriding the surface of the bottom electrode and the crystallized $Hf_{1-x}La_xO$ layer proceeds by performing a thermal process at an electric furnace set in an atmosphere of $NH_3$ provided with a flow rate ranging from approximately 25 sccm to approximately 250 sccm and maintained at a temperature ranging from approximately 600° C. to approximately 800° C. along with one of an ascending pressure.

* * * * *